(12) United States Patent
Liu et al.

(10) Patent No.: US 9,666,556 B2
(45) Date of Patent: May 30, 2017

(54) FLIP CHIP PACKAGING

(71) Applicant: Taiwan Semiconductor Manufacturing Company, Ltd., Hsin-Chu (TW)

(72) Inventors: Yu-Chih Liu, Taipei (TW); Chien-Kuo Chang, Hsinchu County (TW); Chi-Yang Yu, Taoyuan County (TW); Jing Ruei Lu, Taipei (TW); Chih-Hao Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/754,260

(22) Filed: Jun. 29, 2015

(65) Prior Publication Data
US 2016/0379955 A1 Dec. 29, 2016

(51) Int. Cl.
*H01L 23/48* (2006.01)
*H01L 23/00* (2006.01)

(52) U.S. Cl.
CPC .............. *H01L 24/96* (2013.01); *H01L 24/13* (2013.01); *H01L 24/81* (2013.01); *H01L 2924/3511* (2013.01)

(58) Field of Classification Search
CPC ....... H01L 2924/3511; H01L 2924/142; H01L 2924/386; H01L 24/96; H01L 24/81; H01L 24/13; H01L 24/49; H01L 24/85
See application file for complete search history.

(56) References Cited

U.S. PATENT DOCUMENTS

| 2012/0256280 A1* | 10/2012 | Erhart | H01L 21/561 257/414 |
| 2013/0337608 A1* | 12/2013 | Kotani | H01L 21/561 438/110 |

FOREIGN PATENT DOCUMENTS

| JP | 2002158316 | 5/2002 |
| KR | 20100132232 | 12/2010 |
| TW | 200514284 | 4/2005 |
| TW | 200539487 | 12/2005 |

* cited by examiner

*Primary Examiner* — (Vikki) Hoa B Trinh
(74) *Attorney, Agent, or Firm* — Haynes and Boone, LLP

(57) ABSTRACT

An integrated circuit (IC) package includes a first substrate; a second substrate disposed over the first substrate; a plurality of connectors disposed between the first and second substrates such to electrically couple the first and second substrate; a constraint layer disposed over the first and second substrates such that a cavity is formed between the constraint layer and the first substrate; and a molding material disposed within the cavity and extending through the constraint layer. The constraint layer has a top surface and an opposing bottom surface and the molding material extends from the top surface to the bottom surface of the constraint layer.

20 Claims, 7 Drawing Sheets

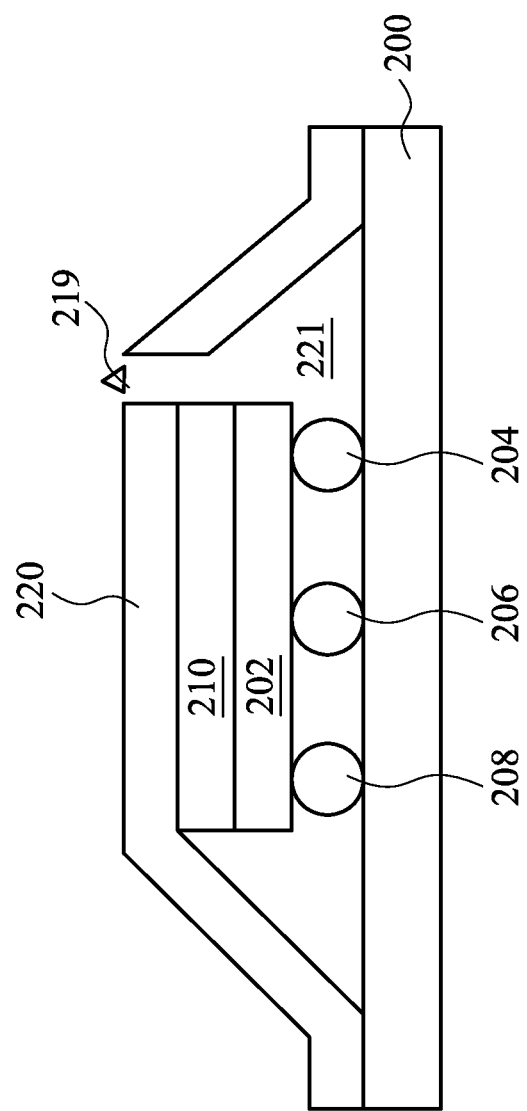

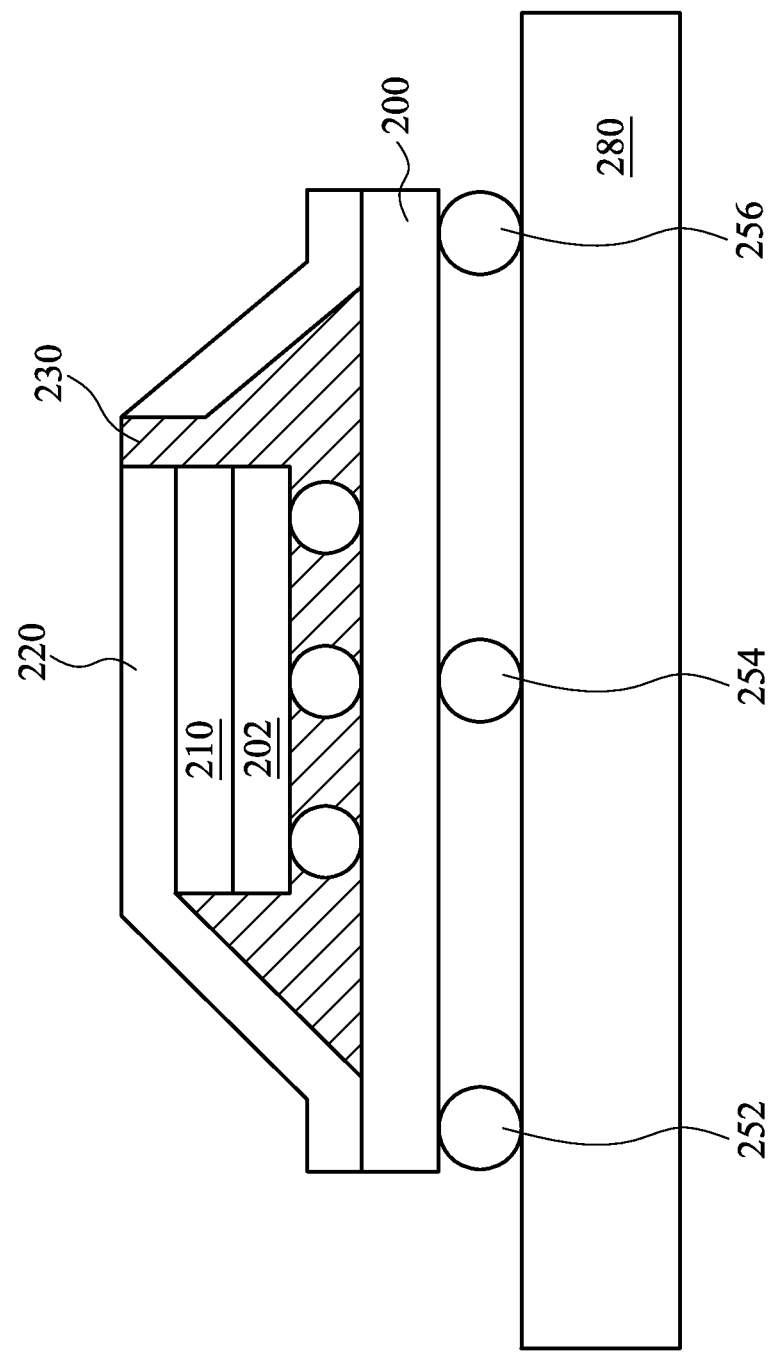

FLIP CHIP PACKAGING

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has increased the complexity of IC processing and manufacturing.

For these advances of the IC processing and manufacturing to be realized, similar developments in IC packaging is also needed. For example, IC chips comprise semiconductor devices formed on a substrate such as a semiconductor wafer and include metalized contact, or attachment, pads for providing an electrical interface to the integrated circuitry. Conventional techniques for providing a connection between the internal circuitry of a chip and external circuitry, such as a circuit board, another chip, or a wafer, include wire bonding, in which wires are used to connect the chip contact pads to the external circuitry. A more recent chip connection technique, known as flip chip package, provides for coupling an IC chip to external circuitry using solder bumps that have been deposited onto the contact pads of the IC chip. In order to mount the chip to external circuitry (e.g., a substrate), the chip is flipped over in an upside-down manner and its contact pads are aligned with matching contact pads on the substrate. Underfill (an adhesive flowed between the chip and the substrate) is then flowed between the flipped chip and the substrate supporting the external circuitry to complete a mechanical and/or electrical interconnection between the IC device and the external circuitry. The resulting flip chip package is much smaller than a traditional carrier-based system, because the chip is positioned directly on the external circuitry, such that the interconnect wires may be much shorter. As a result, the inductance and resistive heat are greatly reduced, enabling higher-speed devices However, due to the inherent coefficient of thermal expansion mismatches between components of the flip chip package such as for example the IC chip, the substrate, and the underfill, high package warpage and thermal stresses are frequently induced in the flip chip package. Such high thermal stresses and warpage not only lead to the delamination in the low-k interconnect layer(s) in the chip, but also cause solder bump cracks leading to failure, degrading the long term operating reliability of the flip chip package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2F illustrate cross-sectional views of a packaged semiconductor device at various fabrication stages in accordance with some embodiments of the present disclosure.

DETAILED DESCRIPTION

Figure 1:
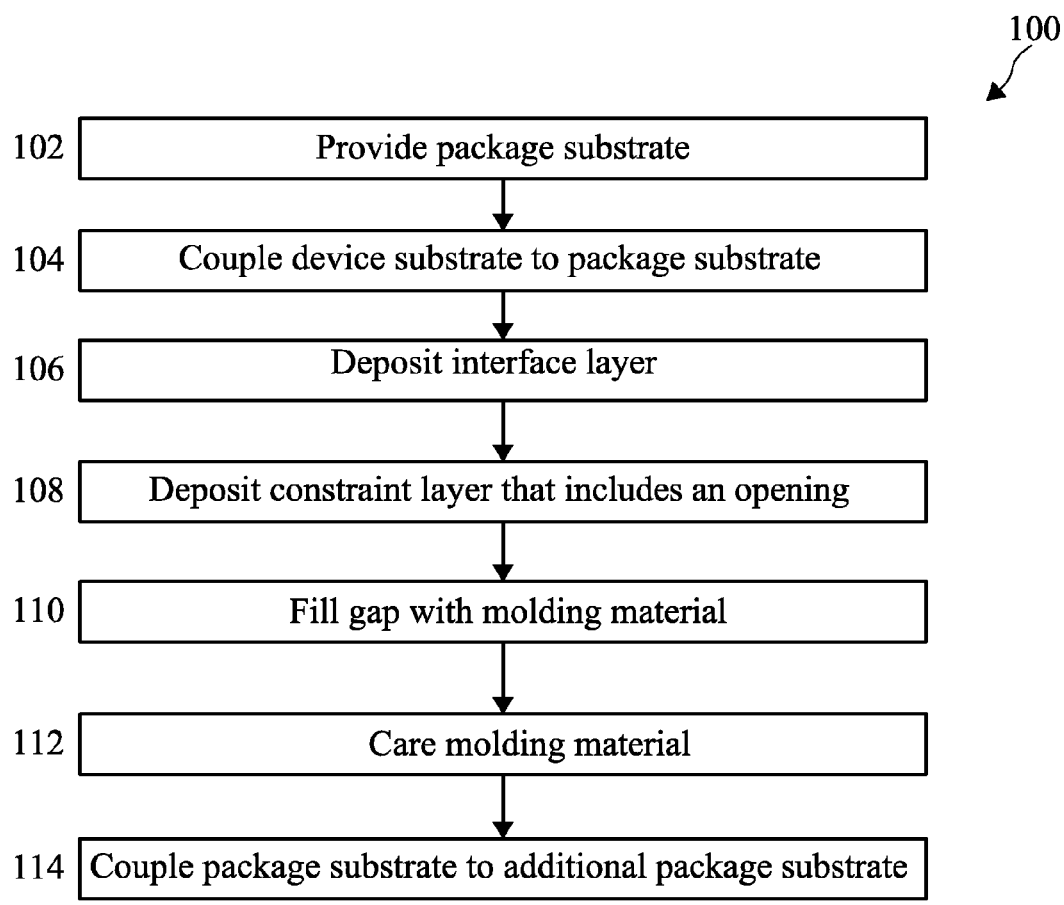
FIG. 1 illustrates a flow chart to package a semiconductor device in accordance with embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring now to FIG. 1, a flow chart of a method 100 of packaging a semiconductor device (chip) is illustrated according to various aspects of the present disclosure. The method 100 is merely an example, and is not intended to limit the present disclosure. Additional operations can be provided before, during, and after the method 100, and some operations described can be replaced, eliminated, or moved around for additional embodiments of the method. The method 100 is described below in conjunction with FIGS. 2A-2F that illustrate, in a cross-sectional view, a portion of a semiconductor chip at various fabrication stages. The chip may be an intermediate device fabricated during processing and/or packaging of an IC, or a portion thereof, that may comprise SRAM and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, other memory cells, and/or combinations thereof.

Figure 2A:
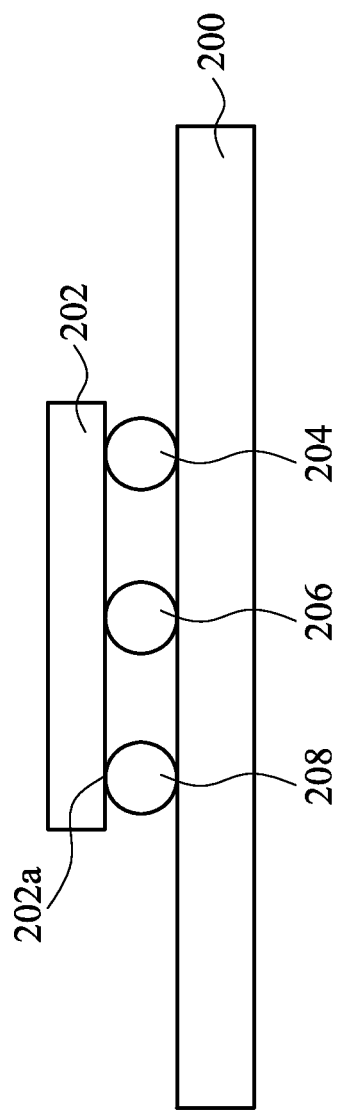
Figure 2B:
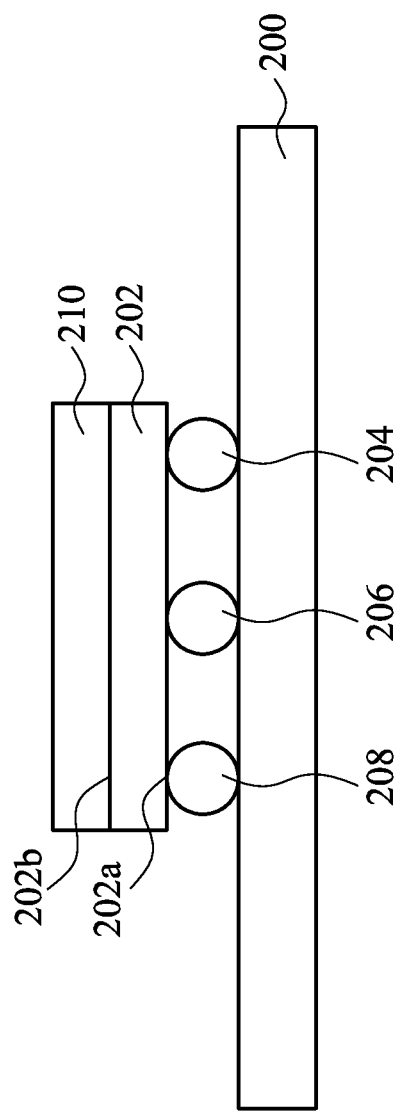
Figure 2D:
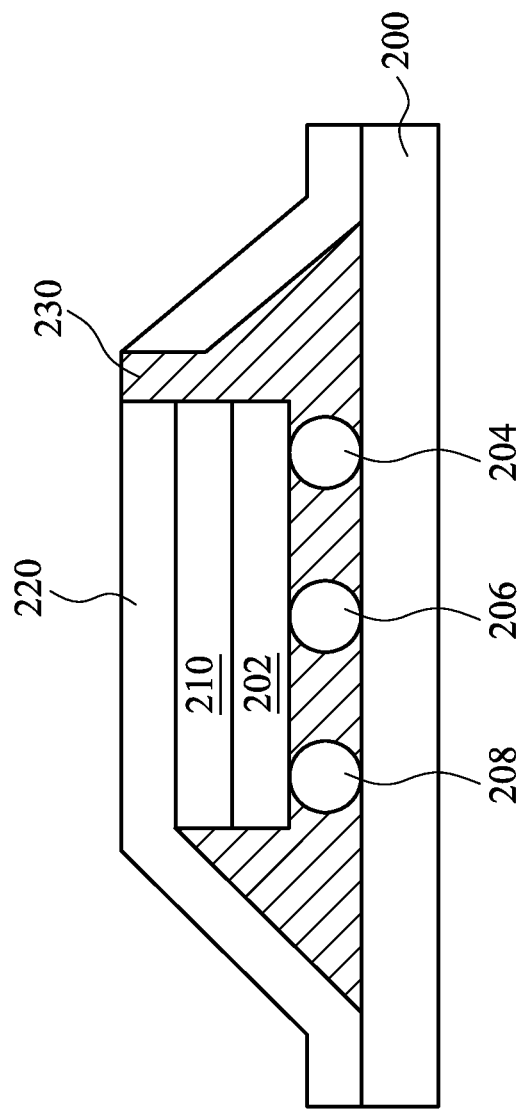

The method 100 starts at operation 102 with providing a package substrate 200 and continues at operation 104 with coupling a device substrate 202 to the package substrate 200 as shown in FIG. 2A. In some embodiments, the package substrate 200 may be implemented in a variety of ways that are operable to provide a real estate for the device substrate 202 as discussed below. For example, the package substrate 200 may comprise a die lead frame, a printed circuit board (PCB), a multiple chip package substrate or other types of substrates.

Referring still to FIG. 2A, the device substrate 202 may comprise one or more microelectronic/nanoelectronic devices, such as transistors, electrically programmable read only memory (EPROM) cells, electrically erasable programmable read only memory (EEPROM) cells, static random access memory (SRAM) cells, dynamic random access memory (DRAM) cells and other microelectronic devices, which may be interconnected to form one or more integrated circuits. The device substrate 202 contemplates one or more substrates on or in which one or more conventional or future-developed microelectronic/nanoelectronic devices may be formed. The bulk of the device substrate 202 and/or the package substrate 200 may be a silicon-on-insulator (SOI) substrate and/or may comprise silicon, gallium arsenide, strained silicon, silicon germanium, carbide, diamond and other materials.

In the illustrated embodiment of FIG. 2A, the device substrate 202 may include one or more solder bumps. As shown, device substrate 202 includes solder bumps 204, 206, and 208 that are secured to a surface 202a of the device substrate 202. Although in the illustrated embodiment of FIG. 2A, the solder bumps 204, 206, and 208 are in a sphere-based shape, a connector in a variety of shapes that is suitable for connecting may be used as one of the solder bumps and still fall within the scope of the current disclosure. Further, such surface 202a of the device substrate 202 may include the above discussed microelectronic/nanoelectronic devices. That is, the solder bumps 204, 206, and 208 may be (electrically) coupled to the microelectronic/nanoelectronic devices. Since device substrate 202 is flipped upside-down (vertically rotated 180 degrees) so as to enable an exposure of the solder bump(s) to the package substrate, the combination of the device substrate 202 and the solder bumps 202, 204, and 208 are generally referred to as a flip chip. That is, surface 202a is also referred to as a top surface of device substrate 202 because the device substrate 202 has been flipped.

The package substrate 200 may further include at least one contact pad that are configured to provide a connection between the package substrate 200 and the device substrate 202. More specifically, each of the contact pads of the package substrate 200 may be aligned with each solder bump of the device substrate so that the device substrate 202 is connected to the package substrate 200 in a desired manner.

The method 100 continues at operation 106 with depositing an interface layer 210 over a surface 202b of device substrate 202. Surface 202b is also referred to as a bottom surface of device substrate 202 because the device substrate 202 has been flipped. In some embodiments, the interface layer 210 is configured to provide an interface for two coupled layers and further bond the two coupled layers. For example, the interface layer 210 bonds the device substrate 202 and a heat spreader (e.g., the constraint layer 220 with respect to FIG. 2C) that is opposite the interface layer 210 from the device substrate 202. The interface layer 210 may be further configured to transfer thermal energy efficiently from surface 202b of the device substrate 202 to a heat spreader (e.g., the constraint layer 220 with respect to FIG. 2C). Thus, any type of materials that are able to bond coupled layers and transfer heat energy from one to the other may be used by the interface layer 210. For example, the interface layer 210 may include: conductive pastes, greases, phase change materials (PCMs), thermal pads and/or thermal films.

The method 100 continues at operation 108 with depositing a constraint layer 220 that includes an opening 219 over the package substrate 200. The constraint layer 220 is used to enclose a top surface of the package substrate 200. In some embodiments, the constraint layer 220 may include high elastic modulus and an intermediate thermal expansion coefficient (e.g., in the range of about 18 ppm/° C. to about 26 ppm/° C.) so as to provide restraint on the packaged device (e.g., the package substrate 200, the device substrate 202, and the constraint layer 220) during thermal cycling when the packaged device is in use. More specifically, during the thermal cycling(s), the constraint layer 220 may serve as a heat-dissipating layer that is operable to dissipate the heat transferred through the interface layer 210. As such, the constraint layer 220 is commonly referred to as a heat sink or a heat spreader. While in a specific embodiment, the constraint layer 220 is made of copper coated with nickel, a variety of suitable metallic/intermetallic materials can be used such as for example, copper aluminide and nickel aluminde. Although the constraint layer 220 of the present disclosure is limited to a thickness ranging between about 0.5 millimeters to 2 millimeters, any value of thickness that is able to provide a desired restraint and heat dissipation may be used and will still fall within the scope of the present disclosure.

Still referring to FIG. 2C, in the illustrated embodiment, the constraint layer 220 may include at least one opening (e.g., 219) that is communication with cavity 221. The opening 219 may be formed via a variety of suitable approaches for providing an opening such as for example, a laser drilling approach, a mechanical drilling approach, and/or a chemical etching approach. Such an opening of the constraint layer is configured to enable molding material to flow through the opening 219 and into cavity 221 as described in more detail below. Although in some specific embodiments, the opening 219 is formed during operation 108 (i.e., the opening is readily formed before depositing the constraint layer 220), the opening 219 may be formed in a separate and an individual operation. For example, the method 100 may include an optional operation (not shown) with providing an opening as discussed above, which may be performed before or after the operation 108.

The method 100 continues in operation 110 by filling cavity 221 with molding material 230. As shown, cavity 221 is defined by package substrate 200, the device substrate 202, solder bumps 204-208, interface layer 210, constraint layer 220. In some embodiments, the molding material includes high tensile modulus that stiffens the packaged device to further protect the device substrate 202 from flexural damage/stress. Such molding material may be, for example, an epoxy polymer, a resin material, etc.

Figure 2E:
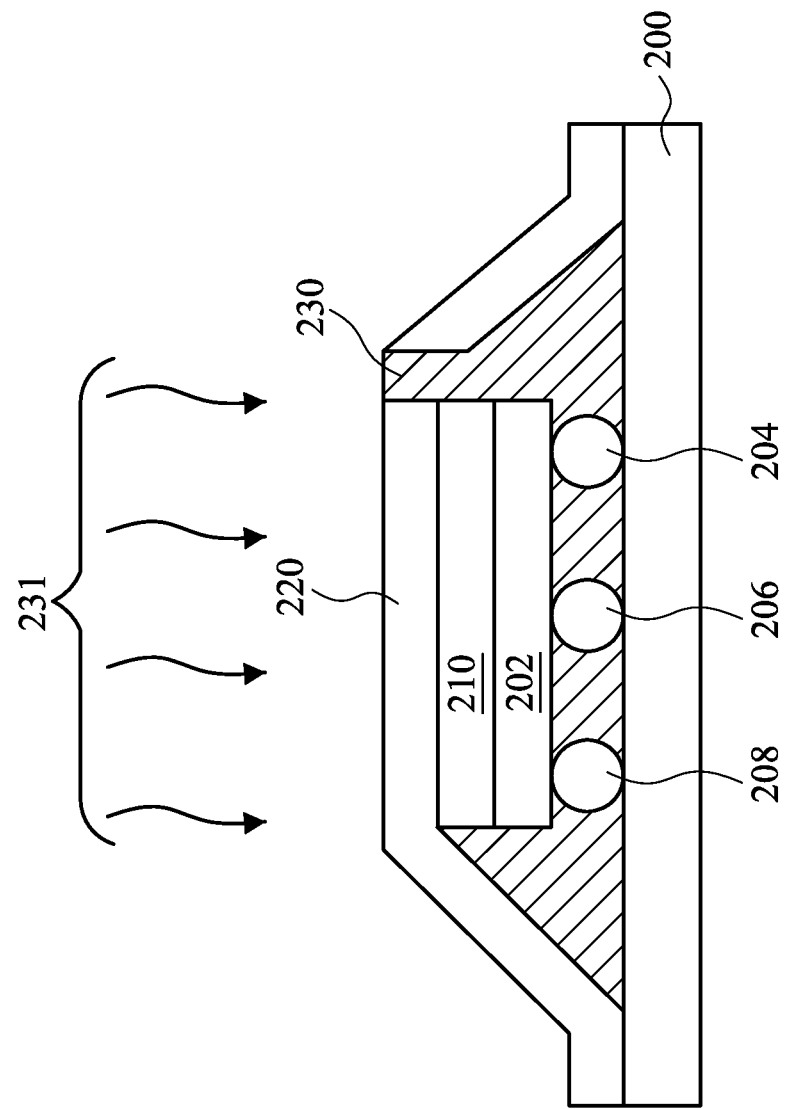

Referring to FIG. 2E, the method 100 continues in operation 112 with curing 231 molding material 230. In some embodiments, curing 231 may include heating the molding material to temperature ranging from around 100° C. to 180° C. so as to harden the molding material 230.

Referring to FIG. 2F, the method 100 proceeds to operation 114 where package substrate 200 is coupled to an additional package substrate 280 through a plurality of solder bumps 252, 254, and 256 that are secured to a bottom surface of the package substrate 200. Such bottom surface of the package substrate 200 is opposite the package substrate 200 from the coupled flip chip (i.e., device substrate 202 and solder bumps 204-208). The additional package substrate 280 may comprise a die lead frame, a printed circuit board (PCB), a multiple chip package substrate or other types of substrates Based on the above discussions, it can be seen that the present disclosure offers various advantages. It is understood, however, that not all advantages are necessarily discussed herein, and other embodiments may offer different advantages, and that no particular advantage is required for all embodiments.

One of the advantages is that the present disclosure offers a novel way of packaging an IC chip. As discussed above, by using the presently disclosed method and system, the constraint layer may not only provide a restraint for the packaged IC chip as a whole but also serve as a heat-dissipation layer. Further, with the opening of the constraint layer, the molding material may be used to evict any possible moisture and/or air present in the gap within the packaged IC chip. Still further, by depositing the disclosed constraint layer (with the opening) to enclose the package substrate, the molding material may fill the gap within the packaged IC chip and after being cured, the molding material may further provide stiffness and/or protection to the device substrate and coupled solder bumps.

The present disclosure provides a method for packaging a device substrate. More specifically, the method includes providing a package substrate; coupling a device substrate to the package substrate; forming a constraint layer that includes an opening over the package substrate and the device substrate, wherein a cavity is defined between the constraint layer and the package substrate; and filling, through the opening of the constraint layer, the cavity with a molding material.

The present disclosure provides a method for packaging a device substrate. More specifically, the method includes coupling a device substrate to a package substrate; forming a metallic layer over the device and package substrates, wherein a cavity is defined between the metallic layer and the package substrate; forming an opening in the metallic layer, wherein the opening is in communication with the cavity; and forming a molding material in the cavity through the opening.

The present disclosure provides an integrated circuit (IC) package. The IC package includes a first substrate; a second substrate disposed over the first substrate; a plurality of solder bumps disposed between the first and second substrates such to electrically couple the first and second substrate; a constraint layer disposed over the first and second substrates such that a cavity is formed between the constraint layer and the first substrate; and a molding material disposed within the cavity and extending through the constraint layer. The constraint layer has a top surface and an opposing bottom surface and the molding material extends from the top surface to the bottom surface of the constraint layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
providing a package substrate;
coupling a device substrate to the package substrate via a solder connector such that the device substrate and the package substrate are electrically coupled together;
forming a constraint layer that includes an opening over the package substrate and the device substrate, wherein a cavity is defined between the constraint layer and the package substrate; and
filling, through the opening of the constraint layer, the cavity with a molding material to surround the solder connector such that the molding material physically contacts the solder connector.

2. The method of claim 1, further comprising depositing an interface layer between the device substrate and the constraint layer.

3. The method of claim 2, wherein the interface layer is configured to bond the device substrate and the constraint layer.

4. The method of claim 1, wherein the molding material includes a material selected from the group consisting of a resin material and a polymer material.

5. The method of claim 1, further comprising curing the molding material that fills the cavity at temperature ranging from about 100° C. to about 180° C.

6. The method of claim 1, further comprising after filling the cavity with the molding material, coupling at least one connector to a bottom surface of the package substrate, wherein the bottom surface is opposite the package substrate from the device substrate.

7. The method of claim 1, further comprising forming the opening through the constraint layer prior to forming the constraint layer over the package substrate and the device substrate.

8. The method of claim 1, wherein the package substrate is a silicon-on-insulator substrate.

9. A method comprising:
coupling a device substrate to a package substrate via a solder connector such that the device substrate and the package substrate are electrically coupled together;
forming a metallic layer with an opening over the device and package substrates, wherein a cavity is defined between the metallic layer and the package substrate; and
forming a molding material in the cavity through the opening to surround the solder connector such that the molding material physically contacts the solder connector.

10. The method of claim 9, further comprising curing the molding material in the cavity.

11. The method of claim 9, further comprising forming an interface layer directly on the device substrate.

12. The method of claim 9, wherein the coupling the device substrate to the package substrate includes bonding a connector on a top surface of the device substrate to an upper surface of the package substrate.

13. The method of claim 9, wherein the molding material includes a material selected from the group consisting of a resin material and a polymer material.

14. The method of claim 9, wherein the metallic layer includes a thickness ranging between about 0.3 millimeters to about 3 millimeters.

15. A method comprising:
coupling a device substrate to a package substrate via a solder connector such that the device substrate and the package substrate are electrically coupled together;
forming an interface layer on the device substrate;

forming a constraint layer over the interface layer, device substrate, and package substrate, wherein a cavity is defined between the constraint layer and the package substrate;

forming a molding material in the cavity to surround the solder connector such that the molding material physically contacts the solder connector; and curing the molding material in the cavity.

16. The method of claim 15, wherein forming the interface layer on the device substrate occurs after coupling the device substrate to the package substrate.

17. The method of claim 15, wherein forming the constraint layer over the interface layer includes forming the constraint layer directly on the interface layer such that the constraint layer physically contacts the interface layer.

18. The method of claim 15, wherein the molding material includes a material selected from the group consisting of a resin material and a polymer material.

19. The method of claim 15, wherein the constraint layer is formed of a metallic material.

20. The method of claim 15, further comprising coupling the package substrate to another package substrate after curing the molding material in the cavity.

* * * * *